United States Patent [19]

Levinson

[11] Patent Number: 4,463,268

[45] Date of Patent: Jul. 31, 1984

[54] VARISTORS WITH CONTROLLABLE VOLTAGE VERSUS TIME RESPONSE AND METHOD FOR USING THE SAME TO PROVIDE A RECTANGULAR VOLTAGE PULSE

[75] Inventor: Lionel M. Levinson, Schenectady, N.Y.

[73] Assignee: General Electric Company, Schenectady, N.Y.

[21] Appl. No.: 499,609

[22] Filed: May 31, 1983

Related U.S. Application Data

[62] Division of Ser. No. 269,225, Jun. 1, 1981, Pat. No. 4,397,775.

[51] Int. Cl.$^3$ .............................................. H03K 3/36

[52] U.S. Cl. .................................... 307/106; 307/268

[58] Field of Search ............... 307/545, 551, 555, 565, 307/268, 318, 106; 361/56, 91, 111; 338/21; 328/54; 323/231, 220, 233

[56] References Cited

U.S. PATENT DOCUMENTS 3,056,046 9/1962 Morgan .............................. 307/106

FOREIGN PATENT DOCUMENTS 10593 1/1977 Japan .................................... 338/21

*Primary Examiner*—William H. Beha, Jr.
*Attorney, Agent, or Firm*—Robert J. Jarvis; James C. Davis, Jr.; Marvin Snyder

[57] ABSTRACT

A bismuth-free, zinc oxide based varistor exhibits a controllable overshoot/undershoot voltage characteristic. The varistor is composed of zinc oxide as the primary constituent, with smaller quantities of barium, boron, one or more transition elements and aluminum. Varistor voltage versus time response is dependent on the degree of aluminum doping. Typically, more than approximately 0.003 mole percent, but less than approximately 0.1 mole percent aluminum is employed, depending on desired voltage overshoot/undershoot characteristic. Varistors having a controllable voltage versus time response are used in a method for providing a rectangular voltage pulse in response to a current input.

7 Claims, 6 Drawing Figures

VARISTORS WITH CONTROLLABLE VOLTAGE VERSUS TIME RESPONSE AND METHOD FOR USING THE SAME TO PROVIDE A RECTANGULAR VOLTAGE PULSE

This application is a division, of application Ser. No. 269,225, filed June 1, 1981, now U.S. Pat. No. 4,397,775.

BACKGROUND OF THE INNVENTION

The present invention relates to zinc oxide based varistors, and in particular to bismuth-free varistors with controllable voltage versus time response.

In general, a metal oxide varistor comprises a zinc oxide (ZnO) based ceramic semiconductor device with a highly nonlinear current-voltage relationship which may be represented by the equation $I=(V/C)^{\alpha}$, where V is the voltage between two points separated by varistor material, I is the current flowing between the points, C is a constant, and $\alpha$ is a measure of device nonlinearity and is a number greater than 1. If $\alpha=1$, the device exhibits ohmic properties. For values of $\alpha$ greater than 1 (typically 20-50 or higher for ZnO based varistors), the voltage-current characteristics approximate those exhibited by back-to-back connected Zener diodes but with much greater voltage, current, and energy-handling capabilities. Thus, if the voltage applied to the varistor is less than the varistor breakdown voltage, only a small leakage current will flow between the electrodes and the device is essentially an insulator having a resistance of many megohms. However, if the applied voltage is greater than the varistor breakdown voltage, varistor resistance drops to an extremely low value (tenths of an ohm), permitting large currents to flow through the varistor. Under varistor breakdown conditions, the current through the varistor varies greatly for small changes in applied voltage so that the voltage across the varistor is effectively limited to a narrow range of values. The voltage limiting or clamping action is enhanced at higher values of $\alpha$.

Metal oxide varistors are widely employed as surge arresters for protecting electrical equipment from transients on AC power lines created by switching of electrical apparatus or lightning storms. Varistors are also employed as circuit elements in voltage-shaping circuits for providing regularly shaped voltage pulses in response to specific irregularly shaped current pulses. Surge arrester applications require varistors having breakdown voltages slightly greater than the maximum input voltage of the protected system. If a transient is incident such that the total voltage applied to the system rises above varistor breakdown voltage, varistor current increases rapidly along its characteristic current voltage curve, whereupon the varistor acts as a conductive shunt path for the incident transient pulse and the voltage to the system is clamped at a constant value. In voltage-shaping applications, the varistor is required to operate similarly to a Zener diode to instantaneously clamp the voltage at a specified level. In each application, it is generally desirable that system voltage rise no more than a predetermined amount when the system is subjected to a current pulse of specified size. Varistors with high $\alpha$ (high nonlinearity) are required for such applications.

It has been found, however, that conventional zinc oxide based varistors containing ($Bi_2O_3$) as an additive ingredient, when exposed to a high, constant current pulse (resemblying some lightning-induced pulses), do not instantaneously clamp voltage at the desired level. In such varistors, voltage has been found to be time dependent, even when the current pulse is time independent. Thus, a varistor subjected to a high, constant current pulse exhibits as initially higher voltage which decreases to a relatively constant value after a few hundred microseconds. The cause for such voltage "overshoot" is not understood, but is known to be unrelated to inductive effects associated with device leads. A voltage overshoot of even a few microseconds is frequently sufficient to destroy sensitive semiconductor devices. Hence, the importance of controlling varistor overshoot voltage is quite apparent.

The present invention provides a bismuth-free ZnO based metal oxide varistor with an essentially flat voltage versus time response. More specifically, the invention provides a varistor with a controllable voltage versus time response. Careful control of varistor composition additive content in accordance with the invention not only reduces voltage overshoot, but allows fabrication of varistors exhibiting a voltage "undershoot". A voltage undershoot characteristic is desirable, for instance, in varistors employed to provide constant voltage output when subjected to particular irregular current pulses.

SUMMARY OF THE INVENTION

The invention comprises a bismuth-free ZnO based metal oxide varistor with controllable voltage versus time response. The varistor is composed of zinc oxide (ZnO) as the primary constituent with smaller quantities of barium, boron, one or more transition elements, and aluminum doping. Barium may be provided as barium oxide (BaO), barium carbonate ($BaCO_3$), or as any conveninet salt. Similarly, boron may be added as boric acid ($H_3BO_3$), or as boron oxide ($B_2O_3$), for example. Transition element additives such as nickel, cobalt, and manganese, are added typically as nickel oxide (NiO), cobalt oxide ($Co_2O_3$), and manganese oxide ($MnO_2$), respectively. Aluminum is provided as, for instance, aluminum nitrate ($Al(NO_3)_3$) or as aluminum carbonate ($Al_2(CO_3)_3$). The mole percentage of aluminum in the varistor controls the voltage overshoot/undershoot characteristic. The desired quantity of aluminum is greater than approximately 0.003 mole percent but less than approximately 0.1 mole percent. Aluminum in the range of between approximately 0.01 mole percent and 0.03 mole percent provides varistors exhibiting slight voltage overshoot to slight voltage undershoot, respectively. At aluminum concentrations of approximately 0.1 mole percent, the varistor exhibits larger voltage undershoot, but has a lower value of $\alpha$.

Varistor devices of the present invention are fabricated by sintering the varistor mix in air at a temperature of between approximately 900° C. to approximately 1400° C. for a period of time ranging up to several hours.

It is an object of the present invention to provide a bismuth-free, ZnO based metal oxide varistor.

It is another object of the invention to provide a bismuth-free ZnO varistor having essentially a flat voltage versus time response.

It is still another object of the invention to provide a bismuth-free ZnO varistor with controllable overshoot-/undershoot voltage characteristic.

A further object of the invention is to provide a bismuth-free ZnO varistor with an overshoot/undershoot voltage characteristic which is variable with aluminum additive content.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

DETAILED DESCRIPTION OF THE INVENTION

Figure 1:
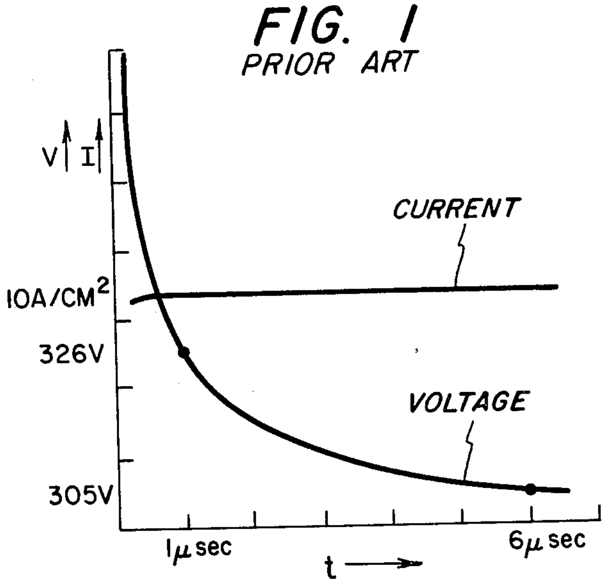
FIG. 1 PRIOR ART
FIG. 1 is a graphical illustration of voltage versus time response of a conventional bismuth-containing metal oxide varistor depicting voltage "overshoot" in response to a 10 ampere/cm$^2$ constant current pulse.
Figure 2:
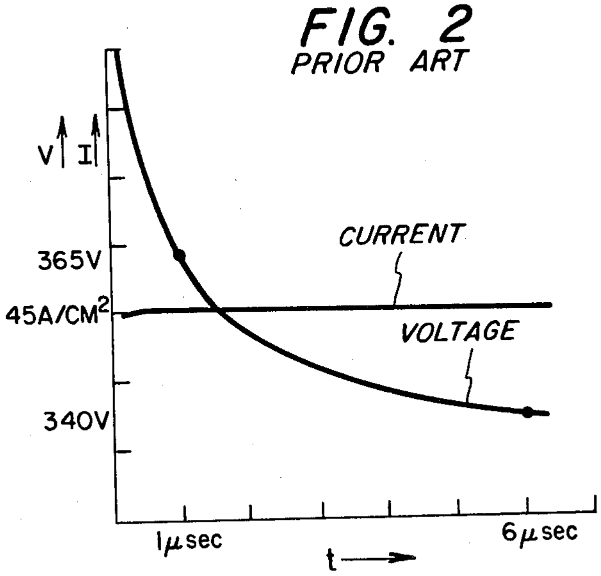
FIG. 2 PRIOR ART
FIG. 2 is a graphical illustration, similar to FIG. 1, of the voltage "overshoot" response of a conventional varistor to a 45 ampere/cm$^2$ constant current pulse.
Figure 6:
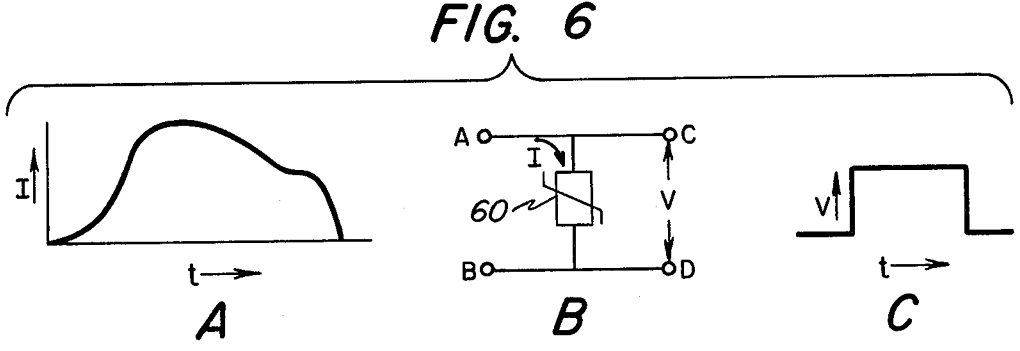
FIG. 6 is a schematic illustration of voltage shaping circuit application of the inventive varistor.

FIG. 1 illustrates voltage versus time response of a conventional ZnO varistor containing bismuth when subjected to a constant 10 ampere/cm$^2$ current pulse. The overshoot in varistor clamping voltage may be observed from the fact that varistor voltage after 1 microsecond is approximately 326 volts, but decays to approximately 305 volts approximately 6 microseconds after the occurrence of the current pulse. FIG. 2 illustrates voltage versus time response of a similar conventional metal oxide varistor to a 45 ampere/cm$^2$ current pulse. Again, a voltage overshoot is observed. After 1 microsecond, the voltage is 365 volts, but decreases to approximately 340 volts at the end of 6 microseconds. In each case, the observed initial varistor voltage is significantly higher than the characteristic varistor clamping voltage measured at times greater than 5 microseconds. Thus, surge arresters, employing conventional varistors, designed to limit voltage rise to no more than a certain amount when subjected to a constant current pulse of specified size, in fact permit voltage to rise to a higher value for a short time. It is apparent then, that if system safe voltage limit is approximately the long time (e.g., 6 microseconds) varistor clamp voltage, the system voltage may unexpectedly exceed this value due to the voltage overshoot effect. Not only may such voltage overshoot be destructive to semiconductor devices, for example, but it renders such varistors unsuitable for use in circuit applications requiring high voltage Zener-diode like instantaneous voltage clamping. An example of such a varistor application requiring a Zener-diode like switching characteristic is illustrated in FIG. 6 and will be described hereinafter.

The present invention provides means to control voltage overshoot. Moreover, selective control of the varistor additive content enables fabrication of a varistor having a voltage undershoot (to be more fully described hereinafter).

The varistor of the present invention is composed of ZnO as the primary constituent (e.g., 70–99.5 mole percent) with smaller quantities of other additives such as barium, boron, one or more transition elements, and aluminum. The additive elements may be added to the unfired varistor mixture as any convenient salt of the additive element since upon sintering, these compounds decompose into oxides of the element. Thus, barium, which replaces bismuth as the constituent providing nonlinear varistor behavior, may be added to the unfired varistor mixture as barium oxide (BaO), barium carbonate ($BaCO_3$), or as any other convenient barium salt. The specific function of boron in varistor behavior is not understood, but its addition is found essential. Boron may be added as boric acid ($H_3BO_3$) or as boron oxide ($B_2O_3$), for instance. One or more transition element additives are necessary to provide device nonlinearity. Transition elements such as nickel, cobalt, and manganese may be added as oxides, NiO, $Co_2O_3$, and $MnO_2$, respectively. The quantity of aluminum doping provides control of varistor voltage overshoot and undershoot properties. Aluminum may be conveninetly added as aluminum nitrate ($Al(NO_3)_3$) or aluminum carbonate ($Al_2(CO_3)_3$). By way of example, and not limitation, a varistor may comprise ½ mole percent of each of $BaCO_3$, NiO, $Co_2O_3$, $MnO_2$, 1 mole percent $H_3BO_3$, and 0.01 mole percent $Al(NO_3)_3$ and the remainder being ZnO. The quantity of aluminum doping may be varied between 0.003 mole percent and 0.1 mole percent depending on the desired varistor voltage overshoot or undershoot property. Increasing the aluminum quantity from 0.003 mole percent results in progressive reduction in voltage overshoot. At between 0.01 mole percent and 0.03 mole percent aluminum, varistors having a slight voltage overshoot to a slight voltage undershoot are obtained. Increasing aluminum doping to 0.1 mole percent results in varistors exhibiting larger voltage undershoot, but lower value of $\alpha$. The quantities of barium-boron and transition element additives may be varied over wide ranges (e.g., 5 mole percent each of barium and boron) without significantly affecting the ability of aluminum doping to control varistor voltage characteristic.

The bismuth-free varistor of the present invention may be fabricated by conventional methods. Typically, the varistor mixture is sintered in air at a temperature of approximately between 900° C. and approximately 1400° C. for a length of time varying between a few minutes to several hours. For the exemplary composition described above, a sintering temperature of approximately 1180° C. has been found satisfactory.

Figure 3:
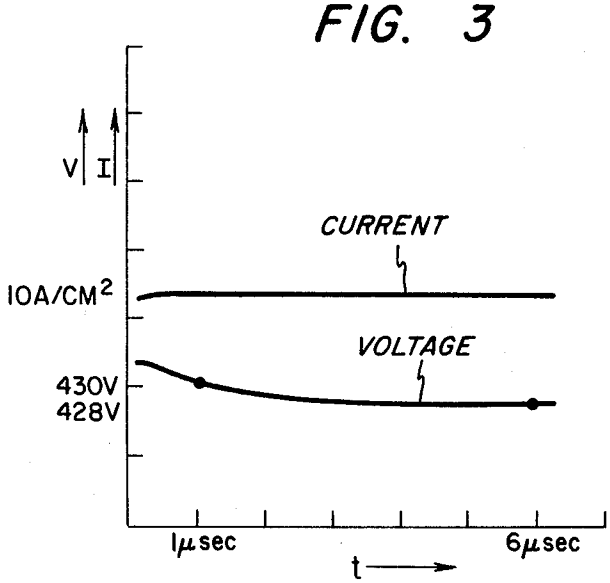
FIG. 3 is a graphical illustration of voltage versus time response of a bismuth-free varistor of the present invention depicting a reduced voltage overshoot in response to a 10 ampere/cm$^2$ constant current pulse.
Figure 4:
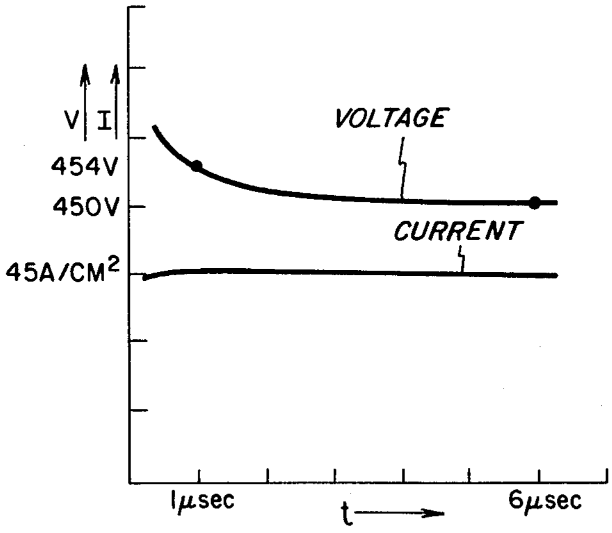
FIG. 4 is a graphical illustration, similar to FIG. 3, of voltage versus time response of a bismuth-free varistor to a 45 ampere/cm$^2$ constant current pulse.

FIGS. 3 and 4 illustrate voltage versus time response of a bismuth-free ZnO based varistor of the present invention, having 0.01 mole percent aluminum doping, to constant current pulses of 10 amperes/cm$^2$ and 45 amperes/cm$^2$, respectively. It may be observed in FIG. 3 that 1 microsecond after the occurrence of the current pulse, varistor voltage is 430 volts, decreasing to 428 volts after 6 microseconds. It is seen in FIG. 4 that for 45 amperes/cm$^2$ excitation after 1 microsecond the voltage is 454 volts, decreasing to 450 volts at the end of 6 microseconds. Thus, for the bismuth-free varistor the difference between the overshoot voltage and characteristic varistor clamping voltage is 2 and 4 volts for constant current pulses of 10 and 45 amperes/cm$^2$, respectively. In contrast, the voltage diference for the prior art varistors (FIGS. 1 and 2) is 26 and 25 volts, respectively. Bismuth-free varistors, exhibiting a lower voltage overshoot, are therefore superior to conventional varistors for applications requiring rapid voltage clamping.

A more quantitative characterization of voltage overshoot may be obtained by empirically defining a quantity ΔV/V, based on the observation that when a varistor is subjected to a high constant current pulse, varistor voltage is initially higher and decreases to a constant value after a few hundred microseconds. The quantity ΔV/V may be expressed as $$\Delta V/V=(V_{short\ time}-V_{long\ time})/V_{short\ time},$$

wherein ΔV/V is a measure of voltage overshoot; $V_{short\ time}$ is the voltage after, for example, 1 microsecond; and $V_{long\ time}$ is the voltage after, for example, 6 microseconds. For applications requiring the varistor to behave as a high voltage Zener diode to instantaneously clamp voltage, it is desired that $\Delta V/V \simeq 0$. The data for conventional varistors (FIGS. 1 and 2) and the inventive bismuth-free varistors (FIGS. 3 and 4) is summarized in the table.

TABLE

| Varistor | Current (amp/cm$^2$) | Voltage (volts) 1μ second | 6μ seconds | ΔV/V |
|---|---|---|---|---|
| Prior Art (FIG. 1) | 10 | 326 | 305 | 0.068 |
| Bismuth-free (FIG. 3) | 10 | 430 | 428 | 0.005 |
| Prior Art (FIG. 2) | 45 | 365 | 340 | 0.044 |
| Bismuth-free (FIG. 4) | 45 | 454 | 450 | 0.009 |

It may be observed from the Table that ΔV/V for bismuth-free varistors is 0.005 and 0.009, respectively, while ΔV/V for prior art varistors containing bismuth is 0.068 and 0.044, respectively. Thus, ΔV/V for bismuth-free varistors is less than 1 percent, but is approximately 5 percent for bismuth-containing varistors. In some instances ΔV/V for conventional varistors may be as high as 2. It is important to note that the varistors in accordance with the invention also exhibit high values of $\alpha$, indicating good nonlinearity properties. A typical value for $\alpha$ is approximatey 30.

Figure 5:
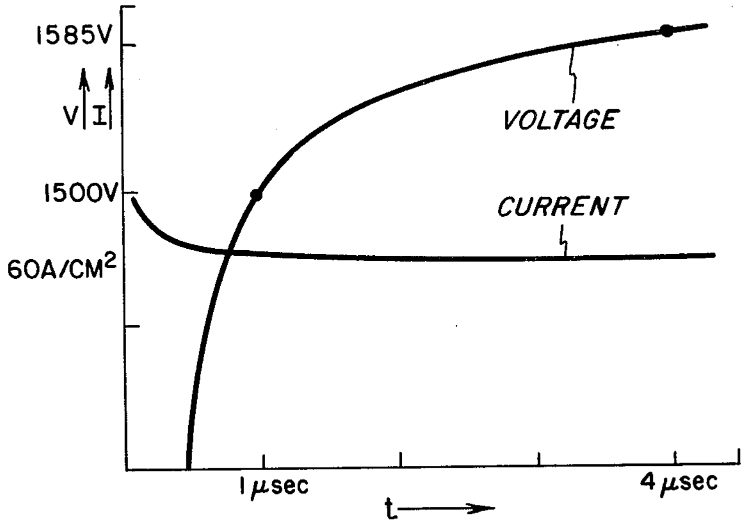
FIG. 5 is a graphical illustration of voltage versus time response of the inventive varistor depicting a voltage "undershoot" in response to excitation by a 60 ampere/cm$^2$ constant current pulse.

FIG. 5 illustrates voltage versus time response of a bismuth-free varistor with 0.015 mole percent aluminum doping depicting a slight voltage undershoot when the varistor is subjected to a 60 ampere/cm$^2$ constant current pulse. A voltage undershoot is characterized by an initially lower varistor voltage which gradually increases to the varistor clamping voltage. In FIG. 5 it may be observed that, for example, at the end of 1 microsecond the voltage is approximately 1500 volts, but increases to approximately 1585 volts at the end of 4 microseconds. The degree of voltage undershoot increases as the aluminum doping quantity begins to exceed approximately 0.015 mole percent.

Varistor voltage undershoot characteristics may be employed to provide a rectangular voltage pulse in response to an irregularly shaped current pulse. For example, if the voltage undershoot charcteristic of varistor 60 in FIG. 6 is properly selected, the regular voltage pulse shown at C may be obtained at terminals C-D of the circuit shown at B when circuit inputs A-B are excited with the irregularly shaped current pulse shown at A. This follows since it is known that the varistor clamp voltage at a fixed time after pulse initiation increases with increased current. The current pulse shown decreases with time. In the absence of undershoot, the varistor voltage at terminals C-D would decrease with time. If the undershoot is chosen appropriately, the short time higher current varistor voltage is reduced so that it equals the long time lower current varistor voltage. This will produce a substantially rectangular voltage at terminals C-D in response to the current pulse I shown flowing in path A-B.

From the foregoing, it may be appreciated that the present invention provides a bismuth-free, ZnO based metal oxide varistor with controlled voltage versus time response. In particular, by varying the quantity of aluminum doping, varistors having a reduced overshoot or flat voltage versus time response or voltage undershoot may be fabricated. In varistors with reduced overshoot, the voltage clamping characteristic more closely resembles the instantaneous clamping action of Zener diodes. The improved varistor characteristics render such varistors more effective for transient protection and voltage shaping circuit elements.

While certain preferred features of the invention have been shown by way of illustration, many modifications and changes will occur to those skilled in the art. It is, therefore, to be understood that the appended claims are intended to cover all such modifications and changes as fall within the true spirit of the invention.

The invention claimed is:

1. A method for producing a rectangular voltage pulse in response to an irregularly shaped current pulse, comprising the steps of:

determining the current level versus time characteristic of an irregularly shaped current pulse, the amplitude of which decreases with time; and applying said irregularly shaped current pulse to a sintered ceramic, bismuth-free ZnO based varistor containing aluminum oxide and having a voltage undershoot chosen such that application of said current pulse, having said current level versus time characteristic, to said varistor results in the short time, higher current varistor voltage being reduced and substantially equal to the long time, lower current varistor voltage, whereby the voltage appearing across said varistor constitutes a substantially rectangular voltage pulse.

2. The method of claim 1 wherein said varistor consists essentially of between about 70 and 99.5 mole percent ZnO as a primary constituent, and finite quantities of additive oxides of barium, boron, aluminum, and at least one additive transition element oxide, said finite additive quantitites in aggregate comprising between about 0.5 and 30 mole percent of said composition, with the amount of said aluminum additive chosen such that the varistor exhibits said voltage undershoot.

3. The method of claim 2 wherein said transition element additive comprises at least one of the group consisting of NiO, $Co_2O_3$ and $MnO_2$.

4. The method of claim 2 wherein said aluminum oxide additive comprises between 0.01 mole percent and 0.1 mole percent.

5. The method of claim 1 wherein said varistor comprises a sintered mixture consisting essentially of 0.5 mole percent of each of $BaCO_3$, NiO, $Co_2O_3$, and $MnO_2$, 1 mole percent $H_3BO_3$), and between 0.01 mole percent and 0.1 mole percent $Al(NO_3)_3$, the balance being ZnO.

6. The method of claim 5 wherein said $Al(NO_3)_3$ is present in an amount of 0.015 mole percent.

7. A method for producing a rectangular voltage pulse in response to an irregularly shaped current pulse, comprising the steps of:

determining the current level versus time characteristic of an irregularly shaped current pulse; and applying said irregularly shaped current pulse to a sintered ceramic, bismuth-free ZnO based varistor containing aluminum oxide and having a voltage versus time response chosen such that application of said current pulse, having said current level versus time characteristic, to said varistor results in the short time varistor voltage being substantially equal to the long time varistor voltage, whereby the voltage appearing across said varistor constitutes a substantially rectangular voltage pulse.

* * * * *

UNITED STATES PATENT AND TRADEMARK OFFICE
CERTIFICATE OF CORRECTION

PATENT NO. : 4,463,268

DATED : July 31, 1984

INVENTOR(S) : Lionel M. Levinson

It is certified that error appears in the above-identified patent and that said Letters Patent is hereby corrected as shown below:

Column 4, line 44, delete "barium-boron" and substitute therefor --barium, boron--.

Claim 5, line 4, delete "$H_3BO_3$)" and substitute therefor --$H_3BO_3$--.

Signed and Sealed this

*Twelfth* Day of *March 1985*

[SEAL]

*Attest:*

DONALD J. QUIGG

*Attesting Officer* *Acting Commissioner of Patents and Trademarks*